United States Patent [19]

Gerritsen et al.

[11] Patent Number: 4,476,352
[45] Date of Patent: Oct. 9, 1984

[54] TELEPHONE SUBSCRIBER LINE LOOPING CIRCUIT

[75] Inventors: Frederik H. Gerritsen, Hilversum; Daniël J. G. Janssen, Eindhoven, both of Netherlands

[73] Assignee: U.S. Philips Corporation, New York, N.Y.

[21] Appl. No.: 363,683

[22] Filed: Mar. 30, 1982

[30] Foreign Application Priority Data

Apr. 1, 1981 [NL] Netherlands ........................ 8101612
Jul. 20, 1981 [NL] Netherlands ........................ 8103419

[51] Int. Cl.³ .............................................. H04M 1/76
[52] U.S. Cl. .................................................. 179/81 R
[58] Field of Search ............ 179/1 MN, 16 F, 18 AB, 179/77, 81 R; 323/311, 223, 226

[56] References Cited

U.S. PATENT DOCUMENTS

| 3,973,082 | 8/1976 | van der Plaats | 179/81 R |
| 4,143,247 | 3/1979 | Yoshitoshi et al. | 179/16 F X |
| 4,167,654 | 9/1979 | Bolus et al. | 179/81 R |
| 4,286,120 | 8/1981 | Sublette | 179/77 X |
| 4,341,991 | 7/1982 | Geboers et al. | 179/16 F X |

FOREIGN PATENT DOCUMENTS

| 2112437 | 10/1980 | Fed. Rep. of Germany | 179/77 |
| 46-1832 | 6/1971 | Japan | 323/226 |
| 1454157 | 10/1976 | United Kingdom . | |

OTHER PUBLICATIONS

Markus, John; *Electronics Circuits Manual;* 1971, McGraw-Hill; New York; pp. 181 and 673.

Primary Examiner—Keith E. George
Attorney, Agent, or Firm—Thomas A. Briody; William J. Streeter

[57] ABSTRACT

A line looping circuit for connection between the wires of a subscriber's line via the hook contact and in parallel with further equipment of the subscriber's set. The circuit comprises the series arrangement of the main current path of one or two field effect transistors and a resistor, the gate of each field effect transistor being connected to the end of the resistor remote from that field effect transistor. The circuit has a low resistance to small currents and a high resistance to high currents.

2 Claims, 3 Drawing Figures

FIG.2  FIG.3

TELEPHONE SUBSCRIBER LINE LOOPING CIRCUIT

BACKGROUND OF THE INVENTION

1. Field of the Invention

A circuit for connection between the conductors of a subscriber's line via the hook contact and in parallel with the further portion of a subscriber's set, the circuit having a relatively low resistance to currents of less than a predetermined value and a relatively high resistance to currents greater than the predetermined value.

Such a circuit may be used in telephony systems. Testing by a telephone exchange as to whether or not the hook contact in a subscriber's loop is closed can be effected in a first manner by applying a voltage of a fixed value between the two wires of the loop an then measuring the current through that loop. Alternatively, testing may be effected in a second manner by passing a current of a fixed value through the loop and measuring the voltage across the loop. In these testing modes the hook contact is assumed to be closed if when testing in the first manner the current exceeds a certain predetermined value (denoted the minimal detection current hereinafter) or if when testing in the second manner the voltage remains below a predetermined value (denoted the maximum detection voltage hereinafter). In the first testing mode the central supply source may be connected during testing to the subscriber's line via supply resistors having a high value with respect to the value of the supply resistors through which the connection is made in the speech condition. An electronic subscriber's set incorporated in this loop has a high resistance if a small current is passed through it. Because of the presence of high-ohmic supply resistors and the high set resistance, it is possible that in the first-mentioned testing mode, when the hook contact is in the closed condition the current in the subscriber's loop is lower than the minimum detection current, so that the exchange does not recognise the subscriber's call. In the second testing mode the detection is prevented because of the fact that the voltage across the subscriber's loop in which the electronic portion of the set is incorporated, is higher than the maximum detection voltage, and also causes the switch closure not to be detected.

2. Description of the Prior Art

It is known to solve the above-described detection problems by using a circuit which is connected behind the hook contact and in parallel with the electronic portion of the set and which has a comparatively low resistance at direct currents below a predetermined value and a relatively high resistance at larger direct currents.

A circuit having these properties is disclosed in the U.K. Pat. No. 1454157, but this circuit has the disadvantage that it has a very complicated structure, so that it is expensive to produce and its reliability of operation is limited by its complicated structure.

SUMMARY OF THE INVENTION

The invention has for its object to mitigate the above-mentioned disadvantages. The invention provides a circuit as described in the opening paragraph characterized in that the circuit comprises the series arrangement of the main current path of a field effect transistor and a resistor, the control electrode of the field effect transistor being connected to the end of the resistor remote from the main current path of the field effect transistor, wherein the resistor has a value such that in normal operating conditions the circuit conducts a current which is low compared with the minimum line current prescribed by the administrations. If the circuit is connected with the correct polarity, then closing of the hook contact causes a current to flow through the main current path of the transistor. For a low voltage difference between the electrodes of the main current path, which electrodes are commonly referred to as the drain and the source, this main current path of the transistor has a low resistance. In this case the resistance of the circuit is substantially fully determined by the series resistance. When the voltage difference between drain and source increases still further, the magnitude of the current through the main current path will assume an approximately constant value.

A further disadvantage of the circuit in accordance with the above-mentioned patent application is that inherently the operation of this circuit is polarity-dependent. This limits the range of usage of this circuit. In order to obviate this disadvantage the circuit of the type described in the preceding paragraph may be characterized in that the circuit further comprises the series arrangement of the main current path of a second field effect transistor and a second resistor, that the ends of the first and second resistors remote from the main current paths of the first and second field effect transistors are commoned and that the control electrodes of the first and second field effect transistors are connected to the junction of the first and second resistors. This very simple measure provides a circuit whose operation does not depend on the polarity and which consequently has a wider range of usage. The transistor which is connected to that wire of the subscriber's loop which has a positive potential relative to the other wire, acts as a current limiter above a certain value of the current through the circuit. At the assumed polarity of the voltage across the circuit the second transistor is driven to full conduction, so that this transistor is substantially no obstacle for the current in the circuit. When the polarity of the voltage across the circuit is reversed, the two transistors interchange their functions. With mutually equal resistors and transistors this circuit has a direct current resistance which does not depend on the direction of the current flowing through it.

The invention further provides a circuit which is characterized in that the circuit comprises the series arrangement of the main current path of the first field effect transistor, the resistor, and the main current path of a second field effect transistor connected in that order, wherein the control electrode of the first field effect transistor is connected to the junction of the main current path of the second field effect transistor and the resistor and the control electrode of the second field effect transistor is connected to the junction of the main current path of the first field effect transistor and the resistor. This measure provides the possibility to produce a polarity-independent circuit with a minimum number of components without affecting the symmetry in the current-voltage behaviour. At a proper choice of the resistor and the transistors, the present circuit has between its terminals the same current-voltage characteristics as the last-described circuit.

Embodiments of the invention will now be described, by way of example, with reference to the accompanying drawings.

BRIEF DESCRIPTION OF THE DRAWING

FIG. 2 shows a second embodiment of a line looping circuit whose operation is polarity-independent, FIG. 3 shows a third embodiment of a line looping circuit, which is polarity-independent and incorporates a minimum number of components.

Corresponding elements in each of the figures have been given the same reference numerals.

DESCRIPTION OF THE PREFERRED EMBODIMENTS

Figure 1:
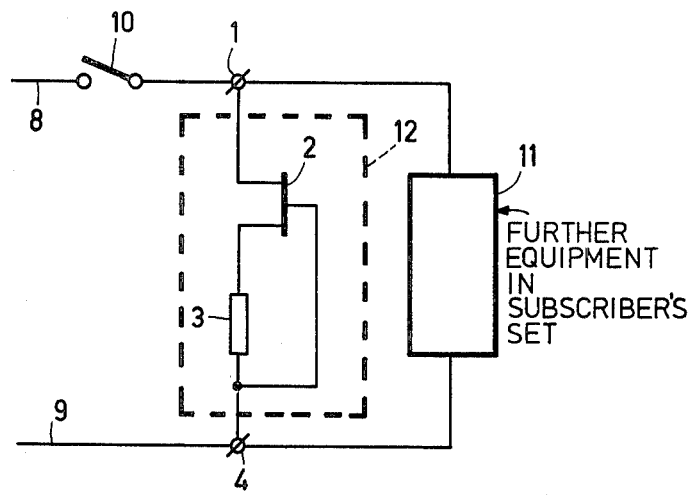
FIG. 1 shows a subscriber's set comprising a first embodiment of a line looping circuit whose operation is polarity-dependent, according to the invention.
Figure 1:
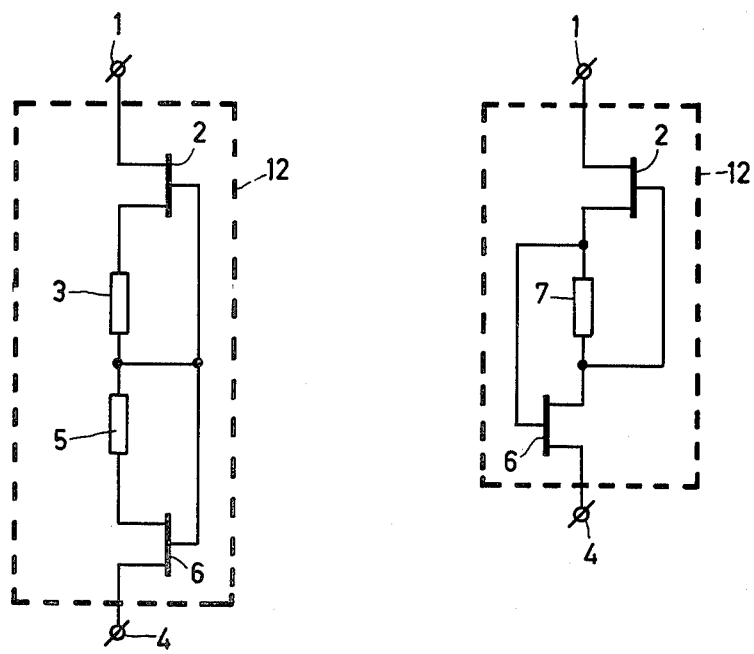

FIG. 1 shows a subscriber's set comprising a first embodiment of a line-looping circuit. The circuit 12 is connected via the hook contact 10 between two conductors 8 and 9 of a subscriber's line to which a subscriber's set is connected. Viewed from the exchange, the circuit 12 is provided subsequent to the hook contact 10 and is arranged in parallel with further equipment 11 of the subscriber's set.

Circuit 12 is formed by a series arrangement of a first connection terminal 1, the main current path of a field effect transistor (FET) 2, a resistor 3 and finally a second connection terminal 4. The terminal 4 is also connected to the control electrode of transistor 2. If connection terminal 1 is raised to a voltage which is higher than the voltage on connection terminal 4 a current will start flowing through the circuit and produce a voltage drop across resistor 3. This voltage drop is equal to the amount by which the voltage across the control electrode (commonly referred to as the gate) is lower than the voltage of the electrode connected to resistor 3. To enable the circuit to operate in the desired manner it is necessary to ensure that the transistor is capable of conducting current if the the control electrode has a negative voltage with respect to each one of the electrodes of the main current path. In addition, it is necessary for the main current path of this type of transistor to have a comparatively low resistance at small negative control voltages and a comparatively high resistance at larger negative control voltages. Since field effect transistors of the depletion type have this desired behaviour, these field effect transistors are used in all the embodiments described. Where in the further course of this description transistors are mentioned this refers to the above-mentioned field effect transistors. At a given circuit voltage, the current through the circuit is determined by the sum of the values of resistor 3 and the resistance of the main current path of the transistor 2. A low current produces a small voltage drop across resistor 3, so also a small (negative) gate voltage of transistor 2. For low gate voltages the main current path of transistor 2 has a resistance which is so small as to be disregarded relative to the value of resistor 3, so that the current-voltage behaviour in the event of a low circuit current is predominantly determined by resistor 3. If the voltage difference between the connection terminals is increased then the circuit current will increase proportionally to the voltage difference until the voltage across the resistor 3 has attained such a value that transistor 2 starts limiting the current. A further voltage increase then only produces a very small change in the current so that in that case the circuit has obtained a very high differential resistance. The circuit is dimensioned so that the circuit current substantially attains a predetermined maximum value if the circuit voltage increases to above a predetermined value. This voltage value is determined by the characteristic of transistor 2. The maximum circuit current is determined by the ratio between this voltage value and the value of resistor 3. This resistor 3 is chosen such that the maximum circuit current is low with respect to the current through the subscriber's loop in speech conditions.

In the event of voltages having a polarity which is the opposite of the above-mentioned polarity, the resistance of the circuit becomes either substantially equal to the value of resistor 3 or equal to the resistance of the conducting gate-source diode of transistor 2, depending on the circuit voltage and on the characteristics of the transistor used.

In cases where either one of the two above-described situations are unwanted, the second embodiment of circuit 12 as shown in FIG. 2 may be used. The circuit 12 shown in FIG. 2 comprises the series arrangement of connection terminal 1, the main current path of transistor 2, resistor 3, a resistor 5, the main current path of a transistor 6 and, finally, connection terminal 4. The control electrodes of transistors 2 and 6 are interconnected and connected to the junction of the two resistors 3 and 5. If the potential on connection terminal 1 is higher than the potential on connection terminal 4 then the combination of transistor 2 and resistor 3 functions in the way as described for FIG. 1. The current through resistor 5 causes the gate voltage of transistor 6 to become positive with respect to the drain voltage of this transistor. As a result thereof, the resistance of the main current path of transistor 6 becomes so low that it can be neglected compared with the sum of the resistors 3 and 5, so that the resistance between the connection terminals of the circuit shown in FIG. 2 is effectively formed by the sum of resistors 3 and 5 and the resistance of the main current path of transistor 2. This means that for circuit currents at which transistor 2 is still in the fully driven state this circuit has a resistance which is substantially equal to the sum of the resistors 3 and 5. Since transistor 2 starts operating as a current limiter at larger circuit voltages, such circuit voltages produce only small current fluctuations so that the circuit then possesses a high differential resistance. If the voltage across the circuit reverses its polarity, then the transistors 2 and 6 reverse their respective functions, so that the operation of the circuit no longer depends on the polarity. If both the transistors and the resistors have equal characteristics, at equal but opposite circuit currents then the circuit has the same resistance. The circuit shown in FIG. 2 can be simplified without detracting from its function. This is done by combining the functions of the resistors 3 and 5 in one resistor having a value equal to the combined value of the resistors 3 or 5. FIG. 3 shows the resultant embodiment of the circuit 12. The embodiment shown in FIG. 3 comprises the series arrangement of connection terminal 1, the main current path of transistor 2, a series resistor 7, the main current path of transistor 6 and, finally, connection terminal 4. The control electrodes of each transistor are connected to that electrode of the main current path of the other transistor which is connected to the resistor 7. The operation of this circuit is similar to that of the circuit shown in FIG. 2, the difference being that in the non-current limiting phase the resistance of the circuit of FIG. 3 is half the resistance of the circuit of FIG. 2. The operation of the circuit shown in FIG. 3 is polarity independent.

What is claimed is:

1. A circuit for connection between the conductors of a subscriber's line via a hook contact and in parallel with a further portion of a subscriber's set, the circuit having a relatively low resistance to currents of less than a predetermined value and a relatively high resistance to currents greater than the predetermined value, comprising a series arrangement of the main current path of a first field effect transistor, a first resistor, a second resistor, and the main current path of a second field effect transistor, connected in that order, and the control electrodes of the first and second field effect transistors being connected to the junction of the first and second resistors, the resistors having a value such that in normal operating conditions the circuit conducts a current which is low compared with a minimum line current.

2. A circuit for connection between the conductors of a subscriber's line via a hook contact and in parallel with a further portion of a subscriber's set, the circuit having a relatively low resistance to currents of less than a predetermined value and a relatively high resistance to currents greater than the predetermined value, comprising a series arrangement of the main current path of a first field effect transistor, a resistor, and the main current path of a second field effect transistor connected in that order, the control electrode of the first field effect transistor being connected to the junction of the main current path of the second field effect transistor and the resistor, and the control electrode of the second field effect transistor being connected to the junction of the main current path of the first field effect transistor and the resistor, the resistor having a value such that in normal operating conditions the circuit conducts a current which is low compared with a minimum line current.

* * * * *